United States Patent [19]

Khan et al.

[11] 4,192,059
[45] Mar. 11, 1980

[54] PROCESS FOR AND STRUCTURE OF HIGH DENSITY VLSI CIRCUITS, HAVING INHERENTLY SELF-ALIGNED GATES AND CONTACTS FOR FET DEVICES AND CONDUCTING LINES

[75] Inventors: Mahboob Khan, Placentia; Gordon C. Godejahn, Jr., Santa Ana; Gary L. Heimbigner; Noubar A. Aghishian, both of Anaheim, all of Calif.

[73] Assignee: Rockwell International Corporation, El Segundo, Calif.

[21] Appl. No.: 913,257

[22] Filed: Jun. 6, 1978

[51] Int. Cl.² .............................................. B01J 17/00
[52] U.S. Cl. ...................................... 29/571; 29/578; 29/590; 357/59
[58] Field of Search ................ 29/571, 578, 589, 590; 357/59

[56] References Cited

U.S. PATENT DOCUMENTS

| | | | |
|---|---|---|---|
| 3,475,234 | 10/1969 | Kerwin | 29/571 |
| 3,699,646 | 10/1972 | Vadasz | 29/571 |
| 3,958,323 | 5/1976 | De La Moneda | 29/571 |
| 4,033,797 | 7/1977 | Dill | 29/571 |

Primary Examiner—W. C. Tupman

[57] ABSTRACT

A process for producing VLSI (very large scale integrated) circuits employs techniques of self-aligned gates and contacts for FET devices and self-aligned contacts for both diffused conducting lines in the substrate and polysilicon conducting lines situated on isolating field oxide formed on the substrate. Mask alignment tolerances are increased and rendered non-critical. The use of materials in successive layers having different oxidation and etch characteristics permits selective oxidation of only desired portions of the structure without need for masking, and removal of selected material from desired locations by batch removal processes again without use of masking. The process and resulting structure affords inherently self-aligned gates and contacts for FET devices and conducting lines. Processing may employ conventional diffusion, oxidation, and etch techniques, although optional high energy ion implant techniques may be employed with simplification and reduction of process steps necessary for conventional diffusion techiques. Direct gate, source, drain, polysilicon line and diffused line contacts are provided. The reduction in size of individual elements and improved interconnection capabilities in accordance with the invention provide VLSI circuits having increased density and reliability.

22 Claims, 25 Drawing Figures

PROCESS FOR AND STRUCTURE OF HIGH DENSITY VLSI CIRCUITS, HAVING INHERENTLY SELF-ALIGNED GATES AND CONTACTS FOR FET DEVICES AND CONDUCTING LINES

BACKGROUND OF THE INVENTION

1. Field of the Invention

The invention relates to the field of semiconductor device fabrication techniques and structures and more particularly to the field of fabrication techniques for the fabrication of very large scale integrated circuits (VLSI) having increased density and reliability and containing FET devices, polysilicon and diffused N+ interconnect lines with self-aligned gates for such devices and self-aligned contacts for such devices and lines, and metalized interconnect lines, said lines interfacing variously with the contacts to the devices and the polysilicon and N+ diffused lines to provide VLSI circuits of increased density and reliability.

2. Prior Art

The semiconductor art has been concerned with reducing the size and power consumption of individual devices and integrated circuits in order to increase the logic power of these circuits per unit area. A particular effort has been extended in the area of monolithic random access memories (RAM's) and read only memories (ROM's) having very large memory capacity. Many things have been done over the years in an attempt to reduce the size of devices and improve tolerances with which they are fabricated. Such efforts have included, inter alia, fine line lithography, improved mask generation and alignment machines, improved tolerances on mask alignment, and self-aligned gates. These techniques have reduced the area required for the fabrication of the individual FET devices used in these integrated circuits. However, because of alignment tolerances, the FET devices must be designed with larger geometry than they would have to be if perfect mask alignment were obtained. Furthermore, becaues of alignment tolerances, the FET devices must be spaced further apart than otherwise necessary in order to allow for the misalignment in the formation of such devices and electrical contacts thereto, and of the interconnection lines and their associated contact positions. Consequently, there is a need for improved integrated circuit fabrication techniques for producing VLSI cir-cuits including FET devices and conducting lines having reduced sensitivity to mask alignment thereby to afford increased density and reliability.

SUMMARY OF THE INVENTION

In a process in accordance with the invention, both the gate oxide layer of the active FET devices of the integrated circuit as well as a silicon nitride layer are formed on the surface of a silicon substrate. Both layers are surrounded by a field oxide layer and simultaneously formed on areas in which diffused N+ conducting lines are to be formed. A polysilicon layer formed on the nitride layer, is delineated to provide the polysilicon conductor of the gates of the FET devices as well as being delineated for additional interconnection lines and then may be partially oxidized in reliance on the masking effect of the nitride layer. This affords minimal oxide layer thickness on the gate polysilicon layer and again contributes to the reduced device size. Subsequently, silicon nitride, silicon oxynitride, silicon dioxide, and photoresist layers are then employed in various masking and selective etch processes to provide a self-aligned gates and contacts for FET devices and self-aligned interconnection interfaces. The fact that silicon nitride, silicon oxynitride, silicon dioxide, photoresist, and silicon all have different etch removal rates when exposed to various etching processes makes it feasible for the number of masking steps to be reduced in comparison to prior art methods and further allows self-alignment features not previously obtainable. In addition, the method described below in accordance with the present invention allows the simultaneous doping of two or more regions. This is advantagous in that the resulting integrated circuit device has move uniform characteristics. As an alternative, high energy ion implant doping techniques may be employed to permit simultaneous doping of all required regions, with reduction in the number of process steps and improved uniformity of doping throughout the structure.

The processes of the present invention permit direct contact of the gate electrode as well as floating gate contact configurations. Diffused conducting lines permit a first level interconnect to source and drain as well as being compatible with a direct gate contact configuration. Conversely, a remote gate contact with direct source and drain contacts may also be afforded. Theoretically, simultaneous and direct source, gate, and drain contacts may be provided although current technology limits the miniaturization of device size and configuration by virtue of the dimensions of the conducting lines in such a simultaneous direct contact device configuration.

These and other objects and advantages of the invention will be apparent from the following detailed description of certain preferred embodiments thereof.

DESCRIPTION OF THE PREFERRED EMBODIMENT

Figure 1:
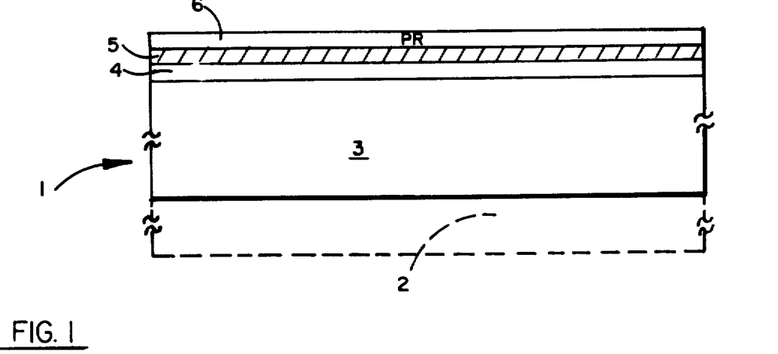
FIGS. 1–7 and 9–12 illustrate partial cross-sectional views of a semiconductor wafer processed in accordance with the present invention. These figures illustrate in chronological order the steps enumerated below.

FIG. 1 illustrates a partial cross sectional view of the wafer used in the fabrication of a device in accordance with the present invention. The substrate 1 can either be a single wafer of semiconductor material 3, typically silicon, or may consist of a semiconductor material 3 in composite with a second substrate material 2, (e.g., silicon on sapphire composite). For illustrative purposes only, the subsequent figures and descriptions have assumed a substrate wafer consisting of a semiconductor 3 of P-type doped silicon of a 100 crystal orientation having a sheet resistivity on the order of 15±4 ohm centimeters.

The silicon layer 3 is first oxidized by means of a thermal oxidation process to produce a silicon dioxide layer atop the silicon 3. Typically, the silicon dioxide layer 4 has a thickness on the order of 500 Å.

Subsequent to the oxidation step, a silicon nitride layer 5 is deposited. This silicon nitride layer 5 typically has the same thickness as the silicon dioxide layer 4.

A photoresist layer 6 is then applied atop the silicon nitride layer 5 and an N-mask is used to selectively mask portions of the photoresist layer 6. The N-mask serves to define selected areas of the substrate surface on which active devices (e.g., field effect transistors) and diffused conducting lines will be formed, these selected areas to be surrounded and isolated by field oxide. Actinic radiation is applied through the N-mask; portions of the photoresist layer 6 which are not protected from the actinic radiation by the N-mask are rendered soluble to the proper developer solution while the remainder of the photoresist layer remains nonsoluble in that solution. Thus, by applying the proper developer solution, areas of the photoresist layer 6 are selectively removed to expose selected portions of the underlying nitride layer 5. The exposed portions of the nitride layers 5 are then removed, using a method which has no effect on the remaining portions of photoresist layer 6, (e.g., plasma etching). The remaining portions of the photoresist layer 6 protect the corresponding underlying portions of nitride layer 5.

Figure 2:
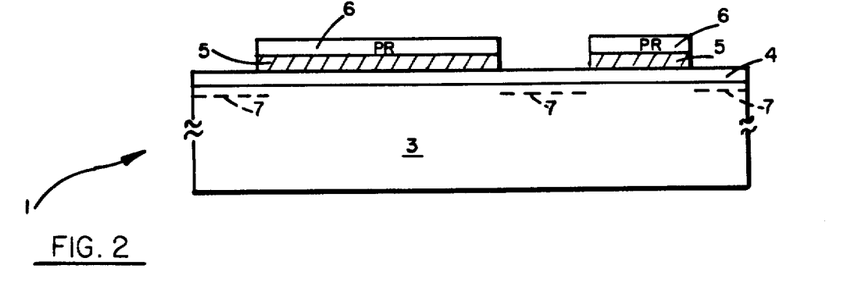

As illustrated in FIG. 2, after the nitride removal step, the substrate wafer 1 includes on its surface the remaining portions of the protective layer of photoresist 6 and the corresponding underlying portions of the silicon nitride layer 5 overlying the silicon dioxide 4 layer at the portions of the substrate which will be later used in the development of N+ diffused lines as well as the active regions, (i.e., source, drain, and gates), of FET devices.

A first dopant ion implant step may then be performed on the wafer 1. In this implant step, a dopant such as boron is implanted into the exposed areas 7 of the silicon 3, at which areas 7 field oxide will subsequently be developed for isolation purposes. The implantation of boron into the silicon substrate 3 at these areas increases the effective isolation between adjacent elements. FIG. 2 illustrates the implantation regions 7 in the silicon layer 3. Areas under the photoresist layer 6 are shielded by the photoresist layer and not doped by the implant step.

Implantation can also be done with the remaining photoresist portions 6 removed in order to implant both the field regions and active channel areas simultaneously. In the fabrication of low voltage integrated circuits, this approach is preferred. This approach also eliminates the subsequently described channel implant step, performed prior to the D mask step.

Figure 3:
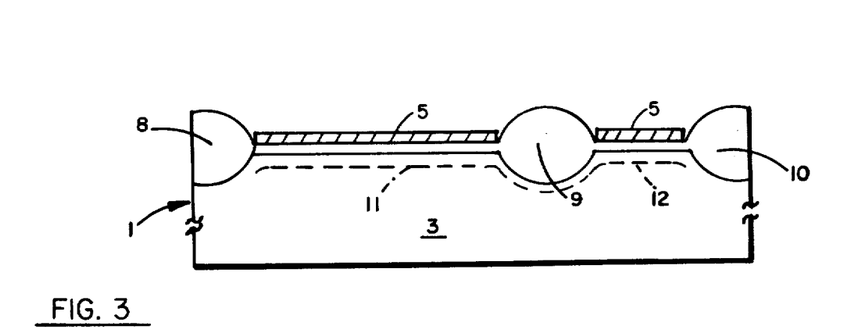

After the optional first implant step, or after the nitride removal step if no implant step is performed, the remaining photoresist layer 6 is removed and the surface of the wafer 1 is subjected to a second oxidation step in order to develop the field oxide regions 8–10 as illustrated in FIG. 3. Typically, these field oxide regions have a thickness of about 9,000 Å. As is apparent from FIG. 3, there is no thermal silicon dioxide layer formed on top of the nitride layer 5. However, a thin (e.g., 100 Å) layer of oxynitride (not shown) is formed on the silicon nitride layer during the field oxidation step. This oxynitride layer eventually remains as a portion of the gate dielectric structure and has been found to increase the overall stability of the oxide-nitride gate structure. Note that FIG. 3 as well as all of the other figures in this application are not drawn to scale but rather have been drawn for maximum clarity.

After the second oxidation step, used to form the field oxide, a further dopant implant step is performed on the wafer 1. By this implant step, an acceptor type dopant such as boron is implanted into the regions of the silicon layer 3 which will ultimately form the channel regions 11 and 12 of an active device (e.g., an FET) and a diffused conducting line, respectively, on the wafer. This implant step allows the adjustment of the threshold of such enhancement devices.

A special ion implant dopant process for depletion devices may be performed at this time. A photoresist layer and a D-mask are used in conjunction with actinic radiation and the proper developer solution in the same fashion as the previously described N-mask. The D-mask provides for exposure and removal of the photoresist only over those selected areas intended to receive active depletion devices, (e.g., gate regions of FETs). The D-mask does not define the gate region, but instead defines an oversize region, a portion of which will be formed into a gate region by a subsequent masking step. Accordingly, the alignment tolerances in positioning the D-mask are not as critical as they otherwise might be. Donor type dopants, such as phosphorus, are implanted in the unprotected areas. The remaining photoresist layer is removed subsequently to the implant step.

A new layer of photoresist (shown in part at 14 in FIG. 4) is applied and then exposed to actinic radiation through an SC substrate contact mask. The SC mask is used to define areas on the substrate on which polysilicon lines will be formed, used for interconnecting elements formed on the substrate 3. For example, two adjacent active devices could be connected in a common source configuration via such a polysilicon line.

Figure 4:
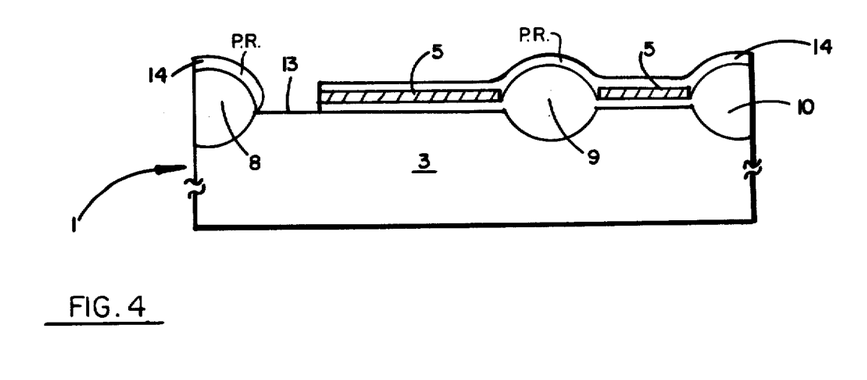

Subsequently to exposure through the SC mask, the photoresist layer 14 is suitably developed and the exposed portions removed, thereby to expose the underlying portion of the nitride layer 5. The exposed and unprotected portion of the nitride layer 5 is then removed, typically using a plasma etch technique. The silicon dioxide layer portion exposed by the removal of the nitride is then subjected to a selective removal process, typically an acid etching process.

FIG. 4 illustrates the wafer after having undergone the above-noted process steps. Area 13 of FIG. 4 is an SC contact area in which the nitride layer 5 and the underlying oxide layer 4 have been removed to expose the silicon layer 3 underneath. The remaining photoresist layer 14 is then removed by conventional technique.

After the removal of the photoresist layer 14, a layer of undoped polycrystalline silicon (polysilicon) 15 (FIG. 5) is applied over the entire surface of the wafer 1. Typically, the polysilicon layer has a thickness of about 6,500 Å. After the polysilicon layer 15 is applied, the wafer 1 is subjected to an oxidation process so as to provide a thin layer 16 of silicon dioxide over the entire surface of the wafer. Typically, the silicon dioxide layer 16 is on the order of 500 Å thick.

Figure 5:
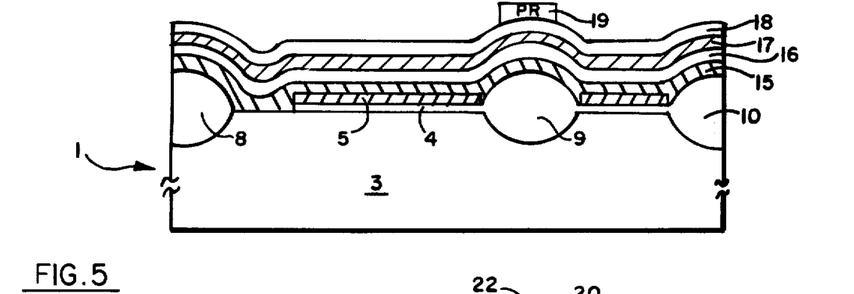

Atop the silicon dioxide layer 16, a silicon nitride layer 17 is deposited over the entire surface. A silicon nitride oxidation step then is performed, typically by exposing the wafer 1 to a steam environment. The steam reacts with the silicon nitride layer 17 to form a thin layer (about 200 Å) of silicon oxynitride 18 atop the silicon nitride layer 17. As an alternative to the steam process to produce the oxynitride layer 18, a thin (e.g., 200 Å) layer of silicon dioxide, silicon oxynitride, or polysilicon may be applied via a chemical vapor deposition (CVD) process to the silicon nitride layer 17. However, for illustrative purposes, the layer 18 over the nitride layer 17 will be assumed to be silicon oxynitride. The layer 18 will be seen to be important in subsequent steps for protecting the underlying nitride layer 17 and, in turn, the polysilicon line contact surface on which it is juxtaposed without the need for separate masking.

FIG. 5 illustrates a cross section of the wafer 1 at this point in the processing. Layer 15 is the polysilicon layer, layer 16 is the silicon dioxide layer. Layers 17 and 18 are respectively the nitride and oxynitride layers.

A photoresist layer 19 is then applied atop the oxynitride layer 18 and actinic radiation is applied to the photoresist layer 19 through a PC-mask. The unwanted portions of the photoresist layer 19 are then removed using an appropriate developing solution. As illustrated in FIG. 5, a small portion of photoresist 19 remains on the oxynitride layer 18 over field oxide 9. The area underneath such photoresist areas will eventually be the location of a self-aligned contact of a polysilicon conducting line to be formed from polysilicon layer 15.

The wafer 1 is then subjected to an oxide removal process, typically an acid etch bath, to remove the unprotected oxynitride layer 18. The portions of the nitride layer 17 exposed by removal of the oxynitride are then removed, typically by means of a plasma etch process. The remaining photoresist layer 19 is then removed. What remains after the photoresist removal is nitride/oxynitride "button" under which will eventually be defined a contact to the polysilicon interconnection line to be formed in the polysilicon layer 15. It is to be noted that the PC mask does not define the precise contact surface, but rather defines a larger area which is then further defined by a subsequent masking operation (G-mask) which defines the polysilicon line to be delineated. Thus, the actual contact area of the polysilicon line is defined and delineated in conjunction with the delineation of the line, affording an inherently self-aligned contact, protected during subsequent processing by the nitride button. Because of the fact that the nitride button defined by the PC mask has a larger area than is needed, (e.g., 11 microns square), the G mask can be applied with a substantial alignment tolerance with respect to the PC mask. For example, the G mask may define a poly line only 4 microns wide. Thus, the mask alignment must only insure that the G-mask polysilicon line be within the PC-mask contact area.

Figure 6:
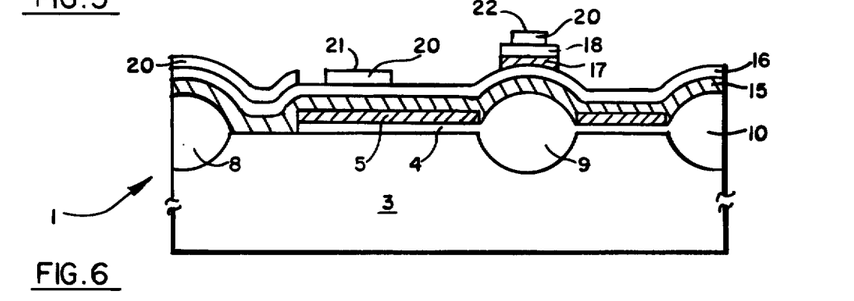

After the remaining photoresist layer 19 has been removed, a new photoresist layer 20 is applied to the wafer 1 and exposed to actinic radiation through the aforementioned G mask. The unwanted photoresist layer 20 is then removed using a suitable developer solution so as to leave the wafer as shown in FIG. 6. Portion 21 of photoresist 20 will define the gate of an active device. Portion 22 of photoresist 20 covers the region which will become the contact area of a polysilicon line. As indicated above, portion 22 is of smaller width than the underlying oxynitride layer 18, which was defined by the aforementioned PC-mask step.

Figure 7:
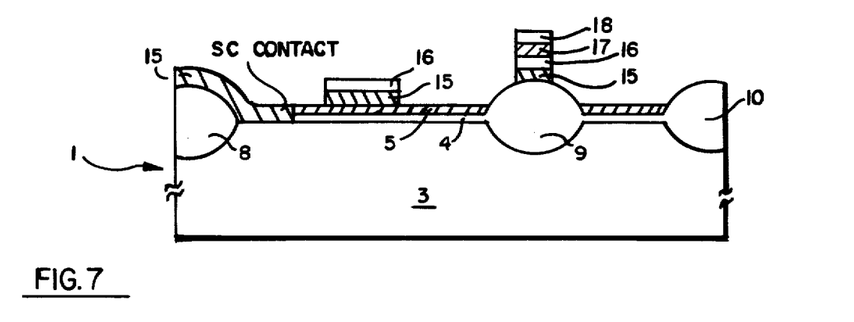

The wafer 1 is then subjected to an oxide removal step, (e.g., acid etching) to remove the exposed portions of the oxynitride layer 18, and then to a nitride removal step, (fluroboric nitride etch) to remove portions of the nitride layer 18 exposed by the removal of the oxynitride layer. The wafer is then subjected to an oxide removal step, (e.g., acid etch), to remove the portions of the oxide layer 16 exposed by the removal of the nitride layer 17 in the previous step. The exposed portions of the polysilicon layer 15 are then removed by a polysilicon removal process (e.g., silver nitrate etching). The photoresist layer 20 is then removed from the wafer leaving the wafer 1 as illustrated in FIG. 7.

It is to be noted that the oxynitride 18/nitride 17 "button" is aligned with and overlies the polysilicon line 15 and its associated silicon dioxide layer 16, since those have been formed by a self-aligned process wherein the remaining nitride button under the area 22 was formed by the the smaller G-mask area which was positioned wholly within the larger PC-mask area.

Figure 8:
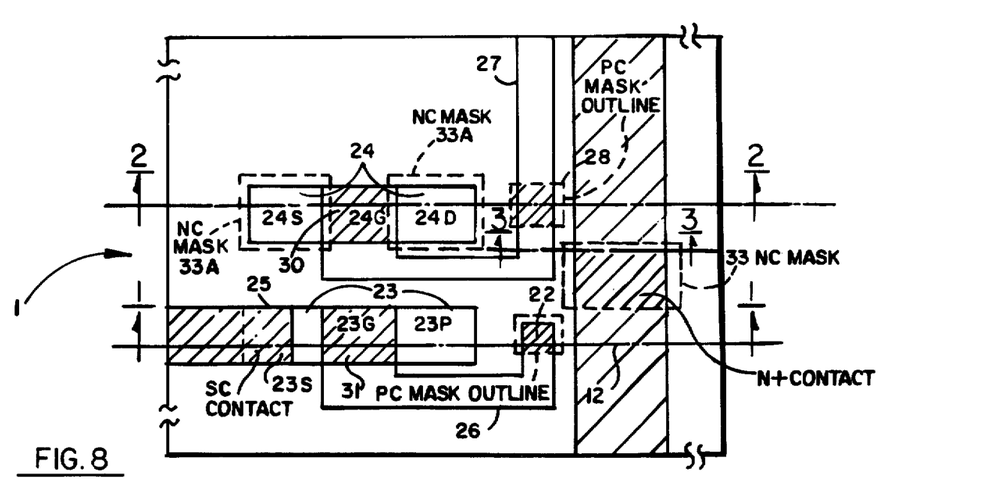
FIG. 8 illustrates a partial plan view of the surface of the semiconductor wafer illustrating the photolithographic masks used in performing the process in accordance with the present invention.

FIG. 8 is a plan view illustrating a composite of structural features and mask/alignment relationships for clarifying the structure existing at this interim stage of the processing of the wafer in accordance with this invention and as well for indicating the relationship of the masks used in performing successive process steps, for producing a complete VLSI structure in accordance with the invention. To better visualize the presentation of FIG. 8, the structure of FIG. 7 corresponds to the cross-sectional view along the line 1—1 in FIG. 8. FIG. 8 illustrates two separate field effect devices 23 and 24, the device 23 including the SC contact 25 seen in FIG. 7. Each of the devices 23 and 24 further is designated by the letters S, G, and D to correspond to source, gate, and drain regions of those transistors.

As discussed in reference to FIGS. 5 and 6, the PC mask defined enlarged areas which eventually would contain the contact surfaces to polysilicon lines formed on the field oxide 9 seen in the cross-sectional views of FIGS. 5 and 6. As also discussed, the G-mask defining polysilicon lines 26 and 27, seen in the cross-sectional view of FIG. 7 as layer 15, produced lines narrower than the polysilicon line contacts of the PC mask. Accordingly, in FIG. 8, the intersection of polysilicon lines 26 and 27 with the respectively associated PC mask outlines are seen to fall within the boundaries of the PC mask outlines and particularly at the areas 22 and 28, those intersecting areas being identified by cross-hatching. The areas 22 and 28 thus will comprise the nitride buttons which, when later removed, will expose the contact surface of the corresponding lines. Since the contacts are defined by the buttons and the buttons are defined simultaneously with the delineation of the lines, it will be appreciated that inherently self-aligned contacts surfaces are provided to the polysilicon lines. It will also be seen that substantial alignment tolerance is afforded as between the G-mask and the PC-mask.

In the arrangement shown, the polysilicon lines 26 and 27 extend intergrally to the respective transistors 23 and 24 and particularly extend over the gate regions 23G and 24G thereof. This configuration provides for remote gate contacts at the contact surfaces 22 and 28 for the respective transistors 23 and 24. In the alternative, the lines 26 and 27 may interconnect other devices and hence the present showing is merely illustrative of the provision of self-aligned contacts to such polysilicon interconnection lines.

FIG. 8 also illustrates in dotted outline form protective areas defined by an NC mask, overlying the source and drain of each of the transistors 23 and 24 and overlying the diffused conducting line 12. Each of the NC mask areas is seen to be enlarged in extent relative to its underlying structure. The purpose of the NC mask is to retain a protective nitride button over the underlying structure of interest, and thus over the source and drain, and over a desired location on the diffused conducting line 12, ultimately to provide self-aligned contact surfaces thereof. As in the case of the polysilicon line contacts, the common intersection area of the NC mask and the diffused conducting line 12 comprises the self-aligned contact surface of the diffused line 12.

The silicon contact 25 illustrated in FIG. 8 in conjunction with transistor 23, overlying the source region 23S thereof, is not operated on in further processing steps in accordance with the invention. Thus, for simplicity of illustration, the ensuing discussion will relate to the transistor 24 and thus the cross-sectional views of the FIGS. 9a through 12a shall be taken with reference to the line 2—2 in FIG. 8. Conversely, FIGS. 9b through 12b are cross-sectional views taken along the line 3—3 in FIG. 8.

Prior to further processing, the wafer and its structure as shown in FIG. 7 optionally may be subjected to a further ion implant if conventional diffusion techniques are employed, for doping the polysilicon line, the source and drain regions, and the diffused connection line. Phosphorus ion implant doping may be employed. Doping the source and drain regions at this stage improves the uniformity of the channel characteristics, i.e., the effective channel length through the gate region of the active devices is rendered more constant. This step, however, is optional.

The next sequence of process steps provides for delineating protective nitride buttons over the souce and drain of the active devices, ultimately to provide contact surfaces to those source and drain regions, and over a desired contact surface area of the diffused line 12. As in the case of the nitride button on the polysilicon line contact, the nitride buttons on the source and drain regions and over the contact surface of the N+ line protect these contact surfaces during subsequent process operations, yet are readily removed by a selective material etch to expose those surfaces, without masking. There results an inherently self-aligned contact surface.

Figure 9A:
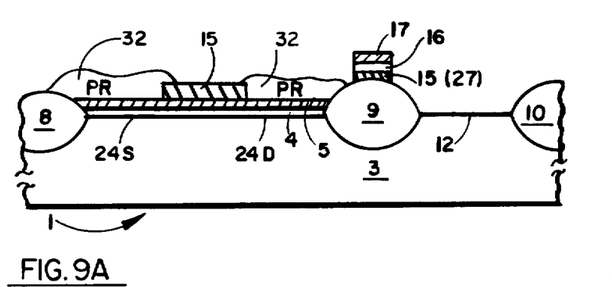
Figure 9B:
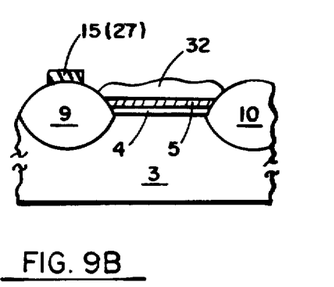

Using the structure as developed through FIG. 7, a photoresist layer 32 is applied thereover and exposed to actinic radiation through an NC contact mask so as to retain portions of the photoresist layer 32 over the source and drain regions 24S and 24D as seen in FIG. 9a and over the contact surface 33 of the diffused line 12 as seen in FIG. 9b. The remaining portion of the photoresist layer 32 is removed so as to expose the underlying nitride layer 5. From before, it will be recalled that an oxynitride layer of about 100 Å remains on the nitride layer 5. An initial oxide etch is performed to remove that oxynitride layer. That oxide etch will remove a portion of the oxynitride layer 18 on the polysilicon line contact illustrated as situated on field oxide 9, but due to its greater thickness (e.g., 200 Å), a portion thereof will remain. Thereafter, the nitride layer 5 is removed in all exposed portions, as by plasma etching. The remaining oxynitride layer 18 protects the nitride layer 17 of the polysilicon line contact button at this time.

The silicon dioxide layer 4 exposed by removal of the nitride layer 5 then is removed, such as by acid etching. This removes the oxynitride layer 18. The resulting structure is as shown in FIG. 9a and 9b wherein the original substrate surface is exposed in the area of the diffused connecting line 12 (see FIG. 9A), except for that portion protected by the remaining photoresist portion 32 (see FIG. 9B). Likewise, the polysilicon line 15 is exposed throughout its length, except in that contact surface portion protected by the nitride button 17. Likewise, the portions of photoresist 32 have protected the source 24S and drain 24D regions, during the nitride and oxide removal steps. Thereafter the photoresist layer 32 is removed.

A donor material (e.g., phosphorus) is then deposited on the structure for purposes of doping the diffused line 12 and the polysilicon line 27, formed from polysilicon layer 15, along their respective exposed surfaces, and for doping the polysilicon layer 15 defining the gate electrode. (It will be apparent that the donor ions are deposited into any such exposed surfaces of the diffused conducting lines, gate regions, and polysilicon conducting lines.)

Figure 10A:
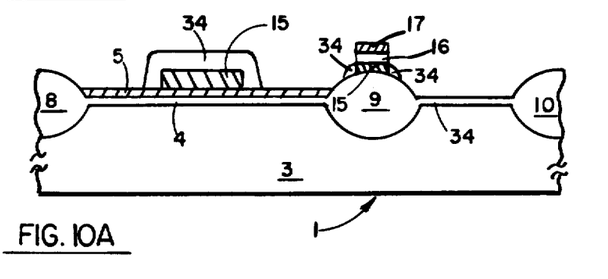
Figure 10B:
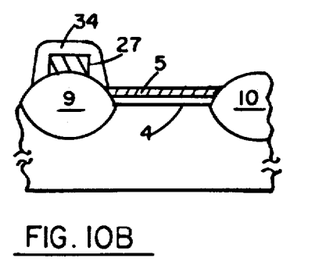

The structure next is subjected to thermal oxidation for converting any exposed surfaces of polysilicon and silicon to silicon dioxide to provide electrical insulator surfaces on those layers. This oxidation process produces a very thick silicon dioxide layer 34, (e.g., 5,500 Å on the exposed polysilicon layer), and on the gates 30 and 31, and N+ line 12, as seen in FIGS. 10A and 10B. Those surfaces of the polysilicon and the silicon substrate protected by the nitride "buttons" are not oxidized significantly during the oxidation step.

The next sequence of process steps is for removal of the nitride buttons to expose the underlying contact surface. The thermal oxidation may produce a thin layer of oxynitride on the exposed nitride buttons. Thus, preparatory to removal of the buttons, an oxide etch is performed for removing that thin oxynitride layer. The relatively much thicker oxide layer 34 provided by thermal oxidation of silicon and polysilicon is etched slightly by this step, but is inconsequential. Thereafter, the exposed nitride "buttons" are removed, using for example, a plasma etch process which selectively removes nitride, but has little or no effect on other exposed materials of the structure. Thus, no masking is required.

Removal of the nitride buttons exposes the underlying oxide layer 16 on the polysilicon line connector 27 (15) and the gate oxide layer 4 overlying the diffused conducting line 12. An oxide removal process, (e.g., acid etching), then is performed for a sufficient period of time to remove the thin (e.g., 500 Å) oxide layer 4 which was under the nitride "buttons", but not for a sufficiently long time to remove any significant amount of the thicker (e.g. 5,500 Å) oxide layer 34 on the gates, poly lines, or N+ lines. Because of this difference in oxide layer thicknesses, selective removal of the thinner oxide 4 can be performed without requiring another masking operation with its inherent misalignment problems.

Figure 11A:
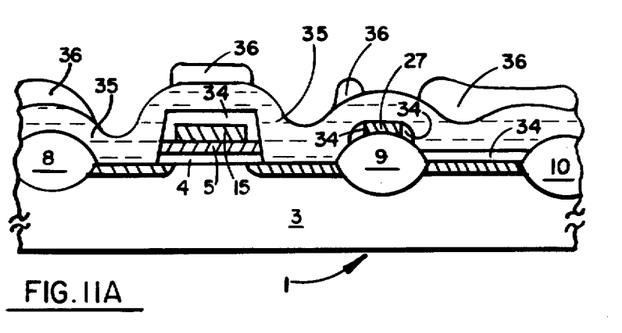
Figure 11B:
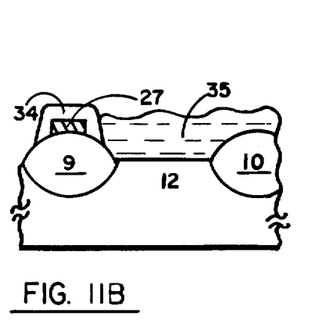

Subsequent to the oxide etching step, a thick layer 35 of phosphorus doped Silox (e.g., 5,000 Å), is applied to the surface of wafer 1 (see FIGS. 11A and 11B). The wafer is then subjected to a density and drive process which simultaneously drives the phosphorus doping ions into the source and drain regions, poly contact regions, and N+ contact regions. These areas were previously covered by nitride buttons during the phosphorus deposition with the result that doping did not proceed into the substrate underlying the nitride buttons.

A photoresist layer 36 is then applied to the surface of the wafer 1, overlying the Silox layer 35 and delineated by a C contact mask which removes portions of the photoresist layer 36 overlying the contact surfaces. The C masking procedure permits opening windows over those contact surfaces for etching away the thereby exposed portions of the Silox layer 35, as shown in FIGS. 11A and 11B. This provides access to the contact surfaces of the source, drain, polysilicon line contact, and diffused line contact. Since the structure is already substantially well insulated electrically, the windows defined by the C mask in the Silox layer 36 may be over-sized and thus need not be critically aligned with the underlying contact surfaces to be exposed. After the windows are thus formed, the structure is subjected to a batch etch for removal of the exposed Silox portions and thus to open the windows and expose the respectively underlying contact surfaces. The remaining photoresist is then removed.

Preferably, the Silox layer 35 is subject to a reflow process in order to smooth the edges of the windows opened by etching through the photoresist 36. Thereafter, a deglazing dip etch is performed to reopen any contact area covered by the Silox during reflow.

Figure 12:
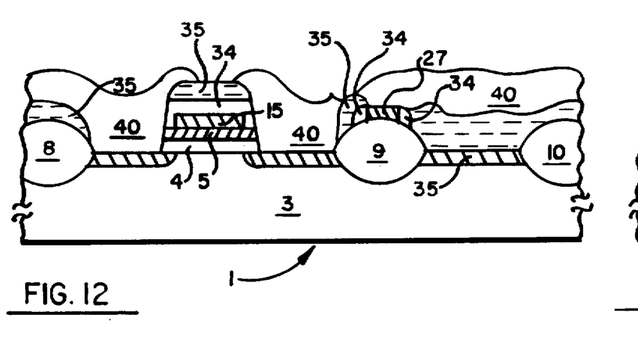
Figure 12B:
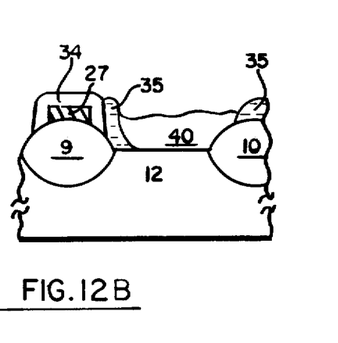

Thereafter, a conductive layer, which may be of metal or other conductive material (e.g., an aluminum-silicon alloy, or polysilicon), is deposited on the remaining Silox layer 35 to extend through the windows and make contact with the contact surfaces of the source, drain, polysilicon line, and diffused line 12. The conductive layer is then delineated to provide independent conductors to these respective contact surfaces, as shown at 40 in FIGS. 12A and 12B. After the delineation of the conductive layer, the structure is annealed and the wafer then subjected to conventional finishing processes.

The delineation of the conductive layer conveniently is performed by actinic radiation through an M-mask which defines the desired interconnection of the devices at the contact surfaces thereof, to each other or to external terminals.

Because the previously formed contacts were surrounded by insulating materials (e.g., Silox, silicon dioxide, and silicon nitride), the positioning of the M-mask, used to define the metalization interconnections, only requires sufficient positional alignment tolerance to insure that the metal interconnect lines do not short out any pair of previously formed adjacent contacts.

In the above description, phosphorus-doped Silox is used to dope the contact regions. If implantation techniques are used to dope the source, drain, polysilicon and diffused lines as described earlier, the steps of depositing Silox and C contact masking are not necessary. However, Silox deposition and C masking techniques can still be used to obtain better coverage of the (metal) conductors over steps and to reduce metal to substrate capacitance.

In the above-noted sequence of process steps, the oxynitride layer 18 was used to protect the PC polysilicon contact site during the nitride removal process associated with the NC masking step, and paticularly, was used to protect the nitride button layer 17 during the nitride removal process associated with the NC masking step. As previously noted, other materials may be employed for the layer 18, so long as this selective etch characteristic is afforded.

FIGS. 1–12 illustrate the case in which the gate region of the field effect transistor is connected through a polysilicon line and remote polysilicon contact to a metal interconnect line delineated by the M-mask. However, it is often desirable to make a direct connection to the gate region by a metal interconnect line delineated by the M-mask. FIGS. 13–19 illustrate such a gate direct contact arrangement.

The same sequence of processing steps described above with regard to FIGS. 1–12 is also fully applicable to FIGS. 13–19. However, the masking areas have been changed so as to produce a self-aligned gate contact directly on the gate region of the field effect device. For comparison purposes, FIGS. 13–15 correspond respectively to FIGS. 5–7 whereas FIGS. 16–19 correspond respectively to FIGS. 9–12.

Figure 13:
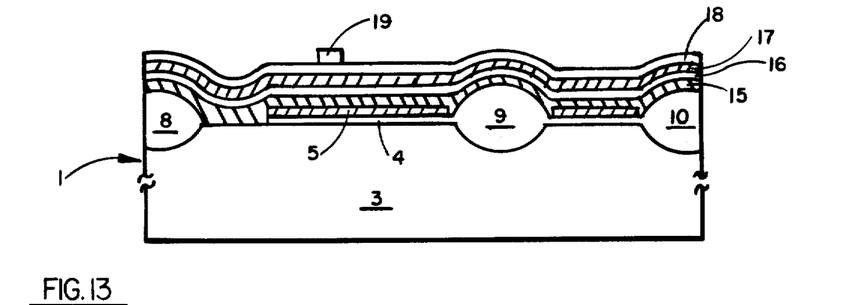
FIGS. 13–19 illustrate partial cross-sectional views of a semiconductor wafer processed in accordance with an alternate embodiment of the present invention.
Figure 14:
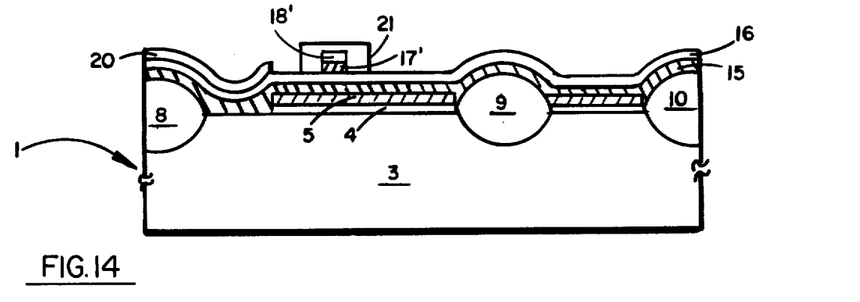

As illustrated in FIG. 13, a portion of photoresist layer 19 has been left protecting an area which will ultimately be defined to be the gate contact. The structure is then subjected to oxide and nitride etches. There remains, as illustrated in FIG. 14, a nitride/oxynitride "button" 17'/18' at the location where the gate contact is to be made. The gate-defining photoresist layer 21, corresponding to that same layer 21 illustrated in FIG. 6, now covers the nitride/oxynitride button 17'/18'.

Figure 15:
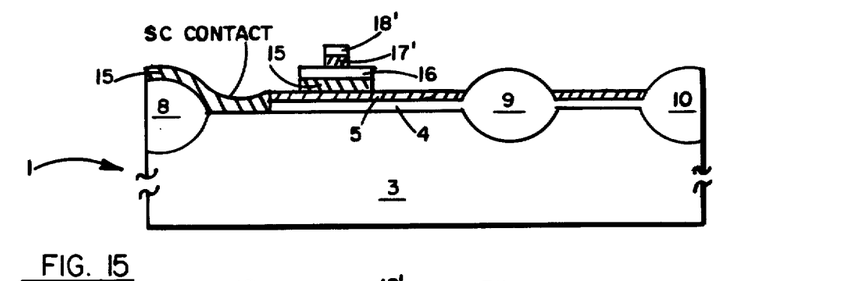

FIG. 15 illustrates the gate polysilicon region 15 covered by a silicon dioxide layer 16 and the nitride/oxynitride gate contact button 17'/18'.

Figure 16:
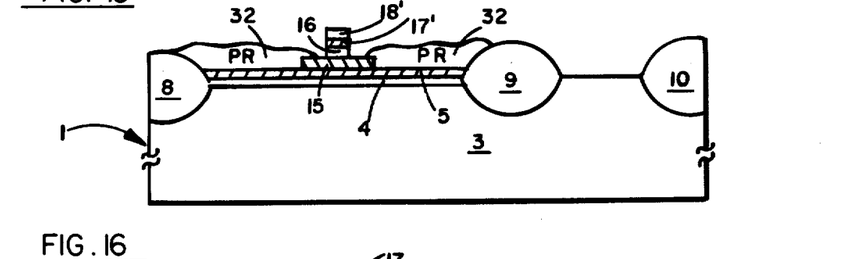

As illustrated in FIG. 16, the now exposed polysilicon gate contact region remains protected by the nitride/oxynitride gate contact button 17'/18'. Thus, when the wafer is subjected to an oxidation process, the area of the gate polysilicon protected by the nitride/oxynitride button 17'/18' will not be oxidized.

Figure 17:
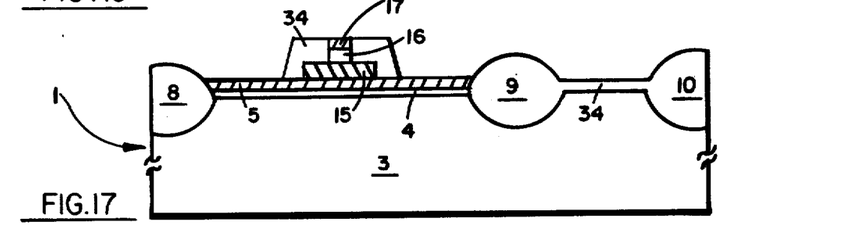

FIG. 17 illustrates the wafer after having undergone thermal oxidation to form the oxide layer 34 over the gate polysilicon region 15—which in this present case is prevented from occurring in the area covered by the nitride/oxynitride gate contact button 17'/18'.

Figure 18:
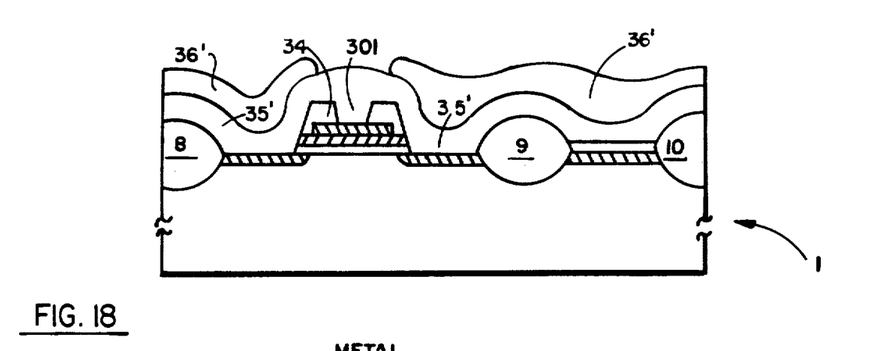

FIG. 18 illustrates the wafer after having been covered by a Silox layer 35' and photoresist layer 36, the latter permitting etching a contact window through the Silox layer 35 so as to expose the gate contact 301. The alignment of the C-mask is not particularly stringent but merely must ensure that the window not overlap the actual source or drain regions. Alternatively, using diffused lines 12 to provide remote source and drain contacts permits removal of the nitride buttons thereover and thermally oxidizing same for electrical insulation.

Figure 19:
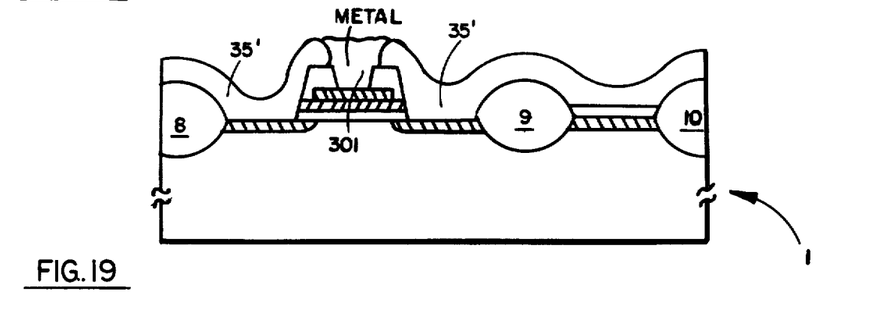

FIG. 19 illustrates the wafer, after having undergone the M-mask and metal etch processes. Note that there is a direct metal to polysilicon contact 301. While the metalization layer 40 typically may be aluminum, a polysilicon metalization layer 40 is also feasible, thus resulting in a polysilicon to polysilicon gate contact interface.

Figure 20:
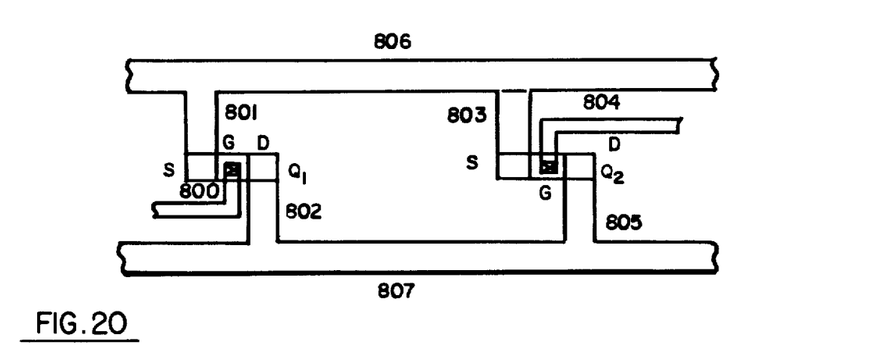
FIG. 20 illustrates an electrical integrated circuit which may be a portion of a VLSI circuit.

FIG. 20 is a partial plan view of a portion of a semiconductor substrate containing elements fabricated in accordance with the present invention. Illustrated are field effect transistor devices $Q_1$ and $Q_2$ each having a source, gate and drain. Connected to the respective sources of transistors $Q_1$ and $Q_2$ are diffused N+ lines 801 and 803 which have been interconnected by means of diffused N+ line 806. Similarly, the drains of transistors $Q_1$ and $Q_2$ are interconnected to each other by means of diffused N+ lines 802, 805, and 807. All of these diffused lines may be delineated simultaneously by means of the N-mask step. As illustrated in FIG. 20, diffused N+ lines 806 and 807 can extend in various directions on the substrate so as to interconnect with a plurality of additional devices. It is of course also possible to provde one or more contact regions to directly interconnect the N+ diffused lines 806 and 807 to the subsequent metalized interconnections delineated in the M-mask step.

The gates of transistors Q₁ and Q₂ are illustrated as being connected to polysilicon lines 800 and 804, respectively. These remote polysilicon lines could be connected to other portions of the circuitry contained on the substrate. In many cases, however a direct contact rather than a remote contact would be provided so as to directly connect the gates of the transistors to the metalized interconnections delineated by the M-mask step.

Figure 21:
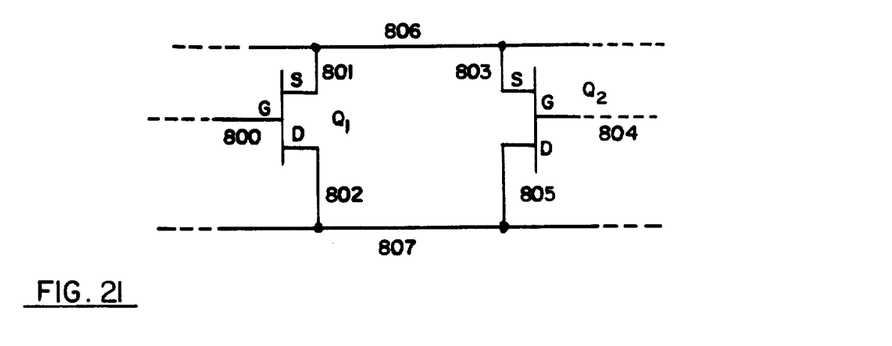
FIG. 21 is the equivalent electrical schematic of the structure of FIG. 20.

FIG. 21 schematically illustrates the portion of the substrate circuitry illustrated in FIG. 20. Like designators of the elements in FIG. 21 correspond to like elements in FIG. 20.

An important usage for the circuitry shown in FIGS. 20 and 21 would be in the fabrication of monolithic random access memories or read only memories having a large number of memory element. As indicated in the Summary of the Invention, the disclosed fabrication process lends itself to the fabrication of circuits having active devices and associated interconnects having substantially reduced surface area in comparison to circuitry fabricated by prior art methods. Since there are inherent size limitations in the surface area of the silicon substrates contained in integrated circuit chips, the advantageous reduction in the overall surface area of the elements fabricated in accordance with the present invention allows for the production of integrated circuit chips having greater numbers of memory elements. For example, the invention renders it feasible to produce random access memory chips in accordance with the present invention having 256 kilobits of memory storage capability whereas present day prior art fabrication techniques have only been able to produce commercially feasible random access memory chips having 32 kilobits of memory sotrage capability.

The processes hereinabove disclosed may be performed using fully conventional diffusion, oxidation and etch techniques. Ion implant steps as performed in the process afford high quality, uniform devices, but nevertheless may be considered optional. Numerous significant features of the invention have been noted throughout. Briefly, the process achieves inherently self-aligned contacts, or contact surfaces, to source, gate, and drain regions of a transistor, to diffused conducting lines, and to polysilicon conducting lines. Remote gate contacts through polysilicon conducting lines may be afforded. Diffused conducting lines may interconnect with source and drain regions, and polysilicon conducting lines disposed on the substrate surface likewise may provide subsurface interconnections, such as between source regions of active devices. Mask alignment tolerances are maximized and thus rendered noncritical, within conventional techniques.

The process of the invention can be modified to eliminate certain diffusion steps, by performing a simultaneous high dose ion implant for doping purposes. As discussed hereinabove, an optional implant may be employed for lightly doping the source and drain regions, which also results in doping of the diffused conducting line region. If performed at high energy, the requisite dosage of $5\times10^{15}$ per square centimeter may be achieved by a single ion implant process step into the source and drain regions as well as into the diffused conducting line region and the polysilicon conducting line situated on the field oxide, and the gate polysilicon layer. High energy implant equipment capable of achieving such dosages, in a time acceptable from a production standpoint, is very expensive and thus normally is not available in most semiconductor fabrication facilities. However, through use of high energy implants, the two separate conventional diffusions employed in the process as hereinbefore set forth may be eliminated. As will be recalled, a first diffusion involving deposition of phosphorus served to dope exposed portions of the diffused conducting line and exposed portions of the polysilicon lines. Subsequently, (after removal of the nitride buttons), a doped Silox layer is deposited directly onto the exposed source and drain regions, the contact surfaces of the polysilicon line contact, and the diffused conducting line contact. Thus, whereas the process does provide for simultaneous doping of different regions, two such diffusion steps are required in this process.

The ion implant technique, in addition to achieving doping simultaneously and thus achieving more uniform doping, permits elimination of the doping step using Silox.

The above, and numerous modifications and adaptations of the invention will be apparent to those of skill in the art and thus it is intended by the appended claims to cover all such modifications and adaptations as fall within the true spirit and scope of the invention.

We claim:

1. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:

thermally growing a first silicon dioxide layer on each of said first and second selected areas, forming a silicon nitride layer on said first silicon dioxide layer, forming a silicon oxynitride layer on said first silicon nitride layer, forming a polysilicon layer on said silicon oxynitride layer extending over said selected areas and said field oxide region, forming a protective button on said polysilicon layer, juxtaposed over the location of a corresponding said polysilicon line conductor to be formed, and of greater width than said line, defining a polysilicon gate electrode extending transversely and centrally of said selected area for said active device, and a polysilicon line conductor, extending at least in part over said field region, of lesser width diminsion than said button and intersecting same in an intersection region, to be formed from said polysilicon layer, removing porions of said button to conform the width of said button to that of said intersection region with said defined polysilicon line conductor, delineating said polysilicon layer to form said line conductor with said conformed button juxtaposed thereon and to form said gate electrode, protecting the portions of said first silicon oxynitride and nitride layers on said source and drain regions and on a selected contact area of said diffused conducting line and removing all unprotected portions of said first silicon oxynitride and silicon nitride layers, removing the silicon dioxide layer portions exposed by removal of said first silicon nitride layer portions, forming a thermal oxide on exposed surfaces of said gate polysilicon layer, of said polysilicon line conductor, and of said diffused line, and removing said first silicon oxynitride and nitride layers from said source and drain regions and said diffused conducting line and removing said button, thereby to expose said contact surfaces of said source and drain regions, of said diffused conducting line and of said polysilicon line conductor.

2. A process as recited in claim 1 further comprising a step of providing conductor lines on said semiconductor substrate extending over said field oxide and onto said polysilicon line contact for providing electrical connection thereto.

3. A process as recited in claim 1 wherein said button comprises a silicon nitride layer, and said step of removing said button comprises applying a material to said substrate which selectively removes nitride and has no substantial effect on said insulating thermal oxide.

4. A process as recited in claims 1 and 3 wherein said button includes on an exposed surface thereof a silicon oxynitride layer and wherein the step of removing said button is performed by subjecting said substrate to an oxide removal process for a sufficient period of time to remove said oxynitride layer of said button without having any substantial effect on said insulating thermal oxide layer.

5. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:

thermally growing a first silicon dioxide layer on each of said first and second selected areas, forming a first silicon nitride layer on said first silicon dioxide layer, forming a silicon oxynitride layer on said first silicon nitride layer, forming a polysilicon layer on said silicon oxynitride layer extending over said selected areas and said field oxide region, forming a second silicon nitride layer on said polysilicon layer, forming a second silicon oxynitride layer on said second silicon nitride layer, retaining a selected portion of said second silicon oxynitride and second silicon nitride layers overlying said field region as a button having a width dimension larger than the width of a polysilicon line conductor to be formed from said polysilicon layer on said field region and removing remaining portions of said second silicon oxynitride and silicon nitride layers, defining a polysilicon gate electrode, extending transversly and centrally of said selected area for said active device, and a polysilicon line conductor, extending at least in part over said field region, of lesser width dimension than said button and intersecting same in an intersection region, to be formed from said polysilicon layer, removing portions of said second silicon oxynitride and silicon nitride layers of said button to conform the width of said button to that of said intersection region with said defined polysilicon lend conductor, delineating said polysilicon layer to form said line conductor with said conformed button juxtaposed thereon and to form said gate electrode, protecting the portions of said first silicon oxynitride and nitride layers on said source and drain regions and on a selected contact area of said diffused conducting line and removing all unprotected portions of said first silicon oxynitride and silicon nitride layers, removing the silicon dioxide layer portions exposed by removal of said first nitride layer portions, and removing said second oxynitride layer of said button, forming a thermal oxide on exposed surfaces of said gate polysilicon layer, of said polysilicon line conductor, and of said diffused line, and, in sequence, removing exposed portions of said first and second oxynitride layers and the thereby exposed portions of said first and second nitride layers, removing the exposed portions of said silicon dioxide layer exposed by removal of said portions of said first silicon nitride layer and any oxide on the exposed contact surface of said polysilicon line conductor, thereby to expose said contact surfaces of said source and drain regions, of said diffused conducting line, and of said polysilicon line conductor.

6. The process as recited in claim 5 wherein said second silicon oxynitride layer is formed to be substantially thicker than said first silicon oxynitride layer, and wherein said step of removing all unprotected portions of said first silicon oxynitride and silicon nitride layers is performed by:

employing an oxide removal process to remove all of said unprotected portions of said first silicon oxynitride layer while not removing all of said thicker second oxynitride layer, and employing a nitride removal process for removing all of said unprotected portions of said first silicon nitride layer while said second silicon oxynitride layer prevents removal of said second silicon nitride layer of said button.

7. A process as recited in claims 1 and 5 further comprising the steps of:

performing a first diffusion doping into the exposed surfaces of said gate polysilicon layer and of said diffused conducting line prior to the step of forming a thermal oxide thereon, and performing a second diffusion into the exposed surfaces of said source and drain regions and of said diffused conducting line.

8. A process as recited in claims 1 or 5 further comprising the steps of:

prior to the step of protecting the portions of said first silicon oxynitride and nitride layers, simultaneously doping all of said source and drain regions, said polysilicon gate conductor electrode, said polysilicon line conductor, and said diffused conducting line by ion implant doping.

9. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer on said first silicon oxynitride layer, forming a second silicon nitride layer on said polysilicon layer, removing said second nitride layer except for retaining a gate contact surface defining portion thereof extending transversly of said selected area in the region of a gate to be defined, protecting said retained portion of said second silicon nitride layer while delineating said polysilicon layer to define a gate polysilicon layer electrode extending transversly of said selected area of said active device of greater width than and in alignment with said retained portion of said second silicon nitride layer, said gate polysilicon layer electrode defining first and second remaining portions of said selected area corresponding to source and drain regions of said device, thermally oxidizing the surface of said gate polysilicon layer electrode while retaining said first silicon nitride and silicon oxynitride layers over said source and drain regions of said active device to prevent formation of any substantial amount of oxide thereon, removing said retained, second silicon oxynitride layer portion from said gate polysilicon layer electrode and simultaneously removing the portions of said first silicon oxynitride layer from said source and drain regions, removing said retained second nitride layer portion from said gate polysilicon layer electrode and simultaneously removing the portions of said first nitride layer portions from said source and drain regions, and removing any silicon dioxide from said gate polysilicon electrode exposed by removal of said second silicon nitride and silicon oxynitride layer portions therefrom, to expose the underlying contact surface of said gate polysilicon layer electrode defined thereby, and simultaneously removing said silicon dioxide layer from said source and drain region sources, thereby to provide a direct contact to said gate polysilicon layer electrode.

10. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer on said first silicon oxynitride layer, forming a protection layer on said polysilicon layer, said protection layer being substantially non-oxidizable by thermal oxidation and being removable by a material-selective removal process having no substantial effect on silicon and silicon dioxide surfaces, removing said protection layer except for retaining a gate contact surface defining portion thereof extending transversly of said selected area in the region of a gate to be defined, protecting said retained portion of said protection layer while delineating said polysilicon layer to define a gate polysilicon layer electrode extending transversly of said selected area of said active device of greater width than and in alignment with said retained portion of said protection layer, said gate polysilicon layer electrode defining first and second remaining portions of said selected area corresponding to source and drain regions of said device, thermally oxidizing the surface of said gate polysilicon layer electrode while retaining said first silicon nitride and silicon oxynitride layers over said source and drain regions of said active device to prevent formation of any substantial amount of oxide thereon, removing said retained, protection layer portion from said gate polysilicon layer electrode and removing said first silicon oxynitride and silicon nitride layers from said source and drain regions, and removing any silicon dioxide from said gate polysilicon electrode exposed by removal of said protection layer portion therefrom, to expose the underlying contact surface of said gate polysilicon layer electrode defined by said protection layer portion, and simultaneously removing said silicon dioxide layer from said source and drain region sources, thereby to provide a direct contact to said gate polysilicon layer electrode.

11. A process as recited claim 10 wherein said protection layer comprises a layer of polysilicon covered by a layer of photoresist.

12. A process as recited in claim 10 wherein said protection layer comprises a layer of silicon nitride covered by a layer of silicon oxynitride.

13. A process as recited in claim 12 wherein said layer of silicon oxynitride is formed by steam oxidation of said silicon nitride layer.

14. A proces as recited in claim 12 wherein said layer of silicon oxynitride is formed by chemical vapor deposition of silicon oxynitride onto said silicon nitride layer.

15. A process for forming a self-aligned contact with polysilicon line conductor to be formed at least in part on the field oxide of a semiconductor substrate, comprising:

forming a polysilicon layer on said substrate extending at least over said field oxide, forming a protective button on said polysilicon layer, juxtaposed on the location of a corresponding said polysilicon line conductor to be formed, and of greater width than said line conductor, defining said polysilicon line conductor, delineating said button to conform in width and location to said defined line conductor, delineating said polysilicon layer to form said line conductor with said conformed button juxtaposed thereon, and to form said gate electrode, thermally oxidizing said polysilicon line to form an insulating oxide layer thereon while said button prevents thermal oxidation of the line conductor portion on which it is juxtaposed, and removing said button by a selective material removal process which does not affect said insulating thermal oxide, thereby to expose the underlying surface portion of said polysilicon line conductor as a contact.

16. A process as recited in claim 15 further comprising a step of providing conductor lines on said semiconductor substrate extending over said field oxide and onto said polysilicon line contact for providing electrical connection thereto.

17. A process as recited in claim 15 wherein said button comprises a silicon nitride layer, and said step of removing said button comprises applying a material to said substrate which selectively removes nitride and has no substantial affect on said insulating thermal oxide.

18. A process as recited in claims 15 or 17 wherein said button includes on an exposed surface thereof a silicon oxynitride layer and wherein the step of removing said button is performed by subjecting said substrate to an oxide removal process for a sufficient period of time to remove said oxynitride layer of said button without having any substantial effect on said insulating thermal oxide layer.

19. A process for forming very large scale integrated circuits on a monocrystalline silicon semiconductor substrate having field oxide surrounding and isolating at least one selected area in which a field effect semiconductor device is to be formed and having at least one polysilicon line conductor disposed at least in part on said field oxide and for providing self-aligned contacts to at least the source and drain regions of said device and to said polysilicon line conductor at a selected location thereof, comprising the steps of:

thermally oxidizing the surface of said semiconductor substrate in said selected area to form a first silicon dioxide layer thereon, forming a first silicon nitride layer on said first silicon dioxide layer, forming a first silicon oxynitride layer on said first silicon nitride layer, forming a layer of polysilicon on said first silicon oxynitride layer and on said field oxide, forming a protective button on said polysilicon layer, juxtaposed over the location of the corresponding said polysilicon line conductor to be formed, and of greater width and said line conductor, defining a polysilicon line conductor to be formed from said polysilicon layer in accordance with the said juxtaposed position of said button and defining a polysilicon gate electrode to be formed in said polysilicon layer, said gate electrode extending transversely and centrally of said selected area for said active device, delineating said button to conform in width and location to that of said line, delineating said polysilicon layer to provide said polysilicon line conductor and said polysilicon gate electrode, thermally oxidizing said polysilicon line conductor and said polysilicon gate electrode to form an insulating oxide on exposed surfaces thereof while said button prevents thermal oxidation of the line portion on which it is juxtaposed and said first silicon nitride and oxynitride layer prevent thermal oxidation of said source and drain regions, removing said button and said first silicon oxynitride and nitride layers overlying said source and drain regions of said device, removing the silicon dioxide layer portions exposed by removal of said first silicon oxynitride and nitride layers and removing any oxide on the surface of said polysilicon line conductor exposed by removal of said button, thereby to expose said contact surfaces of said source and drain regions and of said diffused conducting line.

20. A process as recited in claim 19 further comprising a step of providing conductor lines on said semiconductor substrate extending over said field oxide and onto said polysilicon line contact for providing electrical connection thereto.

21. A process as recited in claim 19 wherein said button comprises a silicon nitride layer, and said step of removing said button comprises applying a material to said substrate which selectively removes nitride and has no substantial affect on said insulating thermal oxide.

22. A process as recited in claim 21 wherein said button includes on an exposed surface thereof a silicon oxynitride layer and wherein the step of removing said button is performed by subjecting said substrate to an oxide removal process for a sufficient period of time to remove said oxynitride layer of said button without having any substantial affect on said insulating thermal oxide layer.

* * * * *